United States Patent
Horton et al.

(10) Patent No.: US 6,306,686 B1
(45) Date of Patent: Oct. 23, 2001

(54) METHOD OF FABRICATING AN ELECTRONIC PACKAGE WITH INTERCONNECTED CHIPS

(75) Inventors: Raymond Robert Horton, Dover Plains; Alphonso Philip Lanzetta, Marlboro; Joseph Maryan Milewski, Binghamton; Lawrence S. Mok, Brewster; Robert Kevin Montoye, Cold Spring, all of NY (US); Hussain Shaukatulla, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/487,747

(22) Filed: Jan. 19, 2000

Related U.S. Application Data

(62) Division of application No. 09/018,698, filed on Feb. 4, 1998.

(51) Int. Cl.[7] ............................................. H01L 21/50
(52) U.S. Cl. ......................... 438/122; 438/108; 438/121
(58) Field of Search ............................. 257/706, 707, 257/712, 713, 720, 779, 686, 723, 724, 738, 777; 438/106, 108, 118, 119, 121, 122, 127

(56) References Cited

U.S. PATENT DOCUMENTS

| | | | |
|---|---|---|---|
| 4,649,418 | 3/1987 | Uden | 257/679 |
| 4,766,670 | 8/1988 | Gazdik et al. | 29/830 |
| 4,868,349 | 9/1989 | Chia | 174/52.4 |
| 4,890,152 | 12/1989 | Hirata et al. | 257/666 |
| 4,992,850 | 2/1991 | Corbett et al. | 257/203 |
| 5,023,202 | 6/1991 | Long et al. | 438/111 |
| 5,032,543 | 7/1991 | Black et al. | 438/107 |
| 5,045,921 | 9/1991 | Lin et al. | 257/680 |
| 5,095,404 | 3/1992 | Chao et al. | 361/385 |
| 5,114,880 | 5/1992 | Lin | 438/107 |
| 5,133,118 | 7/1992 | Lindblad | 29/840 |
| 5,168,430 | 12/1992 | Nitsch et al. | 361/398 |
| 5,220,487 | 6/1993 | Patel et al. | 361/388 |
| 5,263,245 | 11/1993 | Patel et al. | 29/840 |
| 5,285,352 | 2/1994 | Pastore et al. | 361/707 |
| 5,390,082 | 2/1995 | Chase et al. | 361/783 |
| 5,561,322 | 10/1996 | Wilson | 257/703 |
| 5,633,533 | 5/1997 | Andros et al. | 257/707 |

FOREIGN PATENT DOCUMENTS

| | | | |
|---|---|---|---|
| 276387 | 2/1990 | (DE) | 29/840 |
| 8031869 | 2/1996 | (JP) . | |

OTHER PUBLICATIONS

PCT International Application US96/10883 by Diffenderfer and MacQuaurie Title: A Semiconductor Device Package and Method.
Research Disclosure, Feb. 1991, No. 32270, Author Anonymous Title: "Wire Bonded Chops Mounted to Dynamic Flex Cables (Directly to Stiffener)".
May 18, 1993, P. Mescher, MEPPE Conference, Santa Clara, CA Title: "Card Assembly Implication Using the TBGA Module".
Fifth International TAB/Advanced Packaging Symposium, San Jose, CA Feb. 2–5, 1993 by F. Andros & R. Hammer Title: "Area Array Tab Package Technology".*
IBM Technical Disclosure Bulletin, vol. 31, No. 8, Jan. 1989, pp. 135–138, Chen et al., "Thin Film Module".*
IBM Technical Disclosure Bulletin, vol. 27, No. 7B, Dec. 1984, p. 4226.*

* cited by examiner

*Primary Examiner*—Tom Thomas
*Assistant Examiner*—Alonzo Chambliss
(74) *Attorney, Agent, or Firm*—John R. Pivnichny

(57) ABSTRACT

An electronic package which includes a circuitized substrate with a cavity and a first semiconductor chip positioned therein. The first chip is electrically coupled to conductive members located on the circuitized substrate. A second semiconductor chip is positioned on and electrically coupled to the first chip.

5 Claims, 6 Drawing Sheets

METHOD OF FABRICATING AN ELECTRONIC PACKAGE WITH INTERCONNECTED CHIPS

CROSS REFERENCE TO CO-PENDING APPLICATION

This is a division of application Ser. No. 09/018,698, filed Feb. 4, 1998 now pending.

U.S. pat. application Ser. No. 08/848,718 filed May 19, 1997 which describes a flip-chip bonded to pads of an integrated circuit chip is assigned to the same assignee as the instant application.

TECHNICAL FIELD

The invention relates to electronic packages and more particularly to such packages which utilize circuitized substrates and semiconductor devices (chips) as part thereof. Even more particularly, the invention relates to such electronic packages for use in the information handling systems (computer) field.

BACKGROUND OF THE INVENTION

Electronic packages which utilize semiconductor chips as part thereof are known in the computer industry, with examples being shown and described in U.S. Pat. Nos. 4,004,195 (Harayda et al.); 4,415,025 (Horvath); 4,593,342 (Lindsay); 4,914,551 (Anschel et al.); 4,962,416 (Jones et al.) and 5,278,724 (Angulas et al.). With particular attention to U.S. Pat. Nos. 4,593,342 and 4,914,551, the semiconductor chip is electrically coupled to a circuitized substrate which in turn is electrically coupled to a second substrate such as a printed circuit board (PCB). The semiconductor chip may be in turn, thermally connected to a separate heat sinking member to provide heat sinking for the heat generated by the chip during operation. These six patents are incorporated herein by reference.

It is understood that a main objective of those in the modern electronic packaging industry is to significantly increase the circuit densities and operating speeds of various elements (e.g. semiconductor chips and circuitized substrates) which form part of these packages. Mounting semiconductor chips in close proximity is known to improve operating speed by minimizing electrical resistive, inductive and capacitive loading effects on interconnections between the chips. Higher circuit densities, however, lead to a need for more interconnections requiring more space and finer interconnection geometries and therefore higher resistive and inductive effects. Such effects tend to limit operating speeds.

As defined herein, the electronic package of the present invention represents a structure particularly adapted for having high circuit density semiconductor devices and associated circuitized substrates as part thereof while providing high operating speeds. Further, the package is capable of being assembled in a relatively facile and inexpensive manner.

Even further, the structure as defined herein is adapted for accepting a variety of different semiconductor chip configurations and associated circuitized substrate structures, thus providing a much desired versatility for such a package. Even further, the invention as defined herein is readily adaptable to a variety of chip attach manufacturing processes (e.g., wire, thermocompression and/or thermosonic bonding, soldering, etc.).

It is believed that an electronic package possessing the features mentioned above, and others discernable from the teaching provided herein, represents a significant advancement in the electronic packaging field. It is also believed that a new and unique method for making such a package would constitute a valuable contribution to this field.

DISCLOSURE OF THE INVENTION

It is, therefore, a primary object of the invention to enhance the art of electronic packaging by providing an electronic package possessing the several advantageous features defined herein.

It is another object of the invention to provide a method of making such an electronic package.

In accordance with one aspect of the invention, there is defined an electronic package which comprises a circuitized substrate having a cavity therein, electrically conductive members positioned on a surface of the substrate with some of these conductive members located about the periphery of the cavity, a first semiconductor chip positioned within the cavity and electrically coupled to some of the conductive members, and a second semiconductor chip positioned on the first chip and electrically coupled to it.

In accordance with another aspect of the invention, there is provided a method for making an electronic package which comprises the steps of providing a circuitized substrate including a first surface, forming a cavity within the circuitized substrate, positioning a plurality of electrically conductive members on the first surface of the circuitized substrate with at least some of the conductive members located about the periphery of the cavity, positioning a first semiconductor chip substantially within the cavity, electrically coupling the first semiconductor chip to at least some of the conductive members located about the periphery of the cavity, positioning a second semiconductor chip on the first semiconductor chip, and electrically coupling the second semiconductor chip to the first semiconductor chip.

BEST MODE FOR CARRYING OUT THE INVENTION

For a better understanding of the invention, together with other and further objects, advantages and capabilities thereof, reference is made to the following disclosure and appended claims in connection with the above-described drawings.

Figure 1:
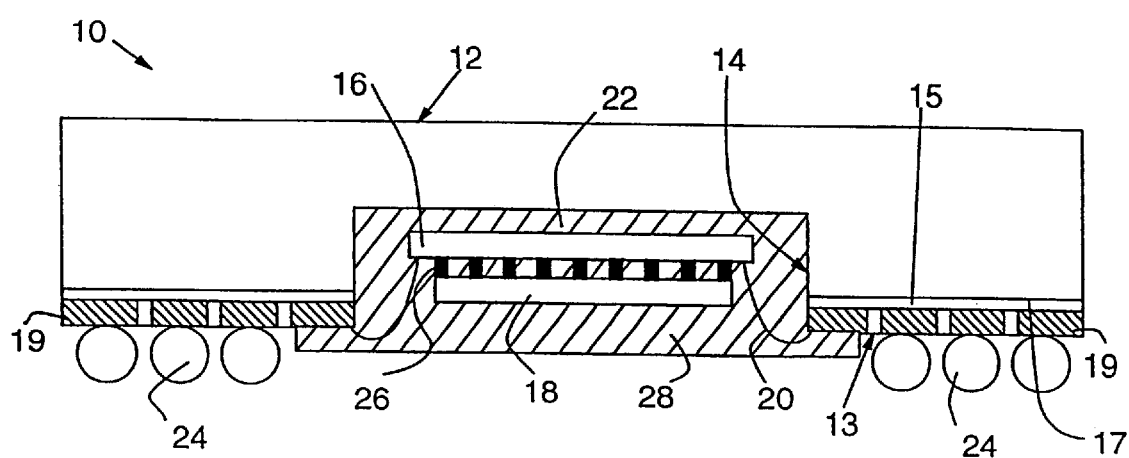
FIG. 1 shows a cross section of one embodiment of the invention using wirebond connections to couple one of the invention's chips to the invention's substrate.

An electronic package 10 in accordance with one embodiment of the invention is shown in FIG. 1. The package comprises a circuitized substrate 12 with a cavity 14. The substrate 12 can be made of ceramic or preferably an organic laminate such as known epoxy-glass. It may have surface and buried wiring layers of a conductive metal such as copper which have been personalized with a wiring pattern. The bottom surface 17 of substrate 12 has electrically conductive pads 19 (e.g. copper, silver, gold, molybdenum) which may be part of a wiring layer 13. Metal balls 24 or columns of copper, solder, or any electrically conductive metal may be attached to some of the conductive pads. The metal balls 24 can be later used for attaching the electronic package 10 to a printed circuit board or other type of electronic package. Wiring layer 13 can be an integral part of substrate 12 or a separately made film or part of a film as described in FIG. 3 below which is later bonded to substrate 12, e.g., with a layer of bonding material 15. (Understandably, layer 15 would not be shown if the circuitry of layer 13 was formed directly on surface 17).

A first semiconductor chip 16 is positioned within the cavity 14 and may be bonded to the cavity 14 with an adhesive layer 22 which is preferably Ablebond P1-8971 adhesive made by Ablestik Elex Materials and Adhesive Co. of Dominguez, Calif. Chip 16 is electrically coupled to some of the bonding pads 19 on wiring layer 13 using conventional wire bonds 20. The wires may be gold, aluminum, copper or any other electrically conductive wire material as known in the art. Significantly, a second semiconductor chip 18 is positioned on and electrically connected to first chip 16 with electrically conductive elements 26 such as solder bumps or gold bumps.

First and second semiconducter chips 16, 18 may comprise circuitry for performing any function. One important application of this and other embodiments of the invention is the use of a processor chip for the first semiconductor chip 16 and a memory chip for second semi-conductor chip 18. Such an arrangement has the advantage of providing very short connection paths, allowing the processor to rapidly access and store data in the memory chip.

Figure 2:
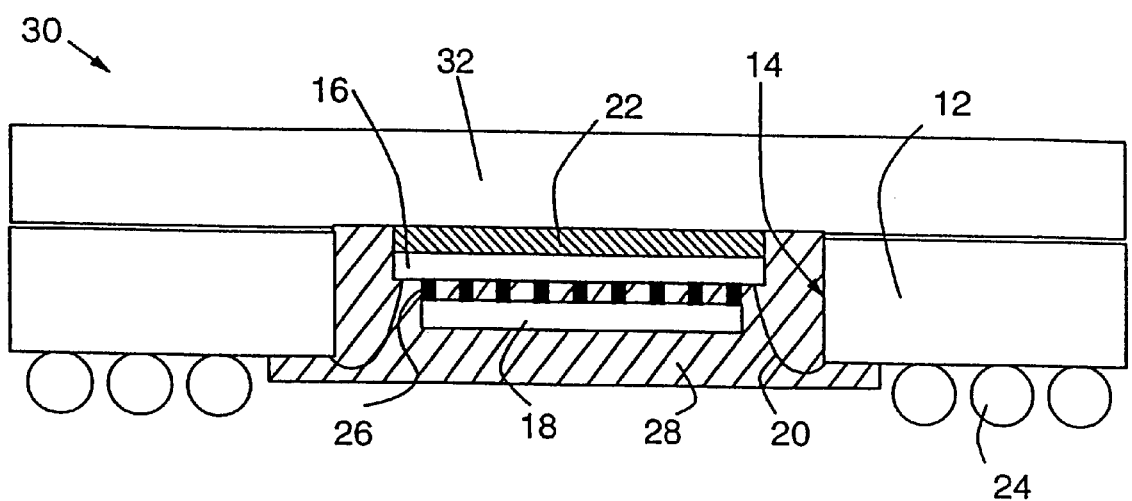
FIG. 2 shows a cross section of another embodiment of the invention wherein a heatsink is utilized.
Figure 3:
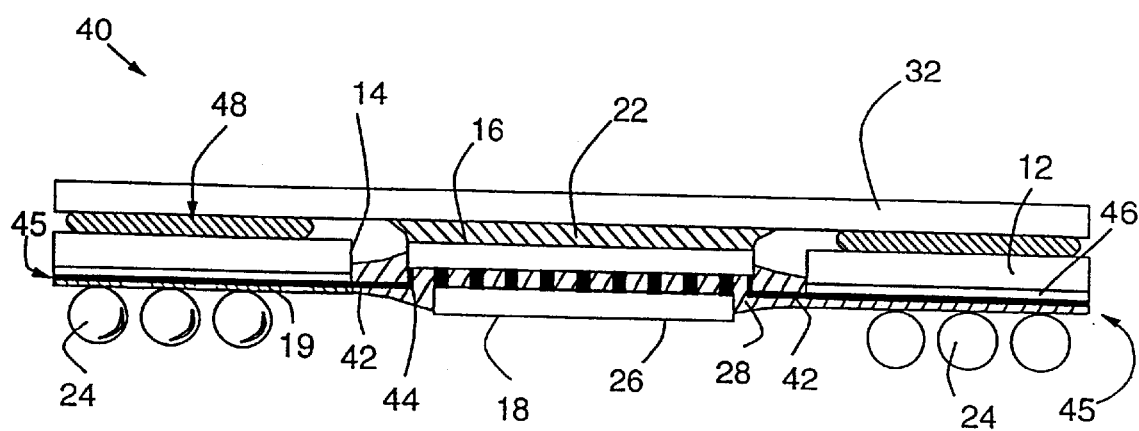
FIG. 3 shows a cross section of yet another embodiment using a plurality of tape leads to couple one of the invention's chips to the substrate.
Figure 4:
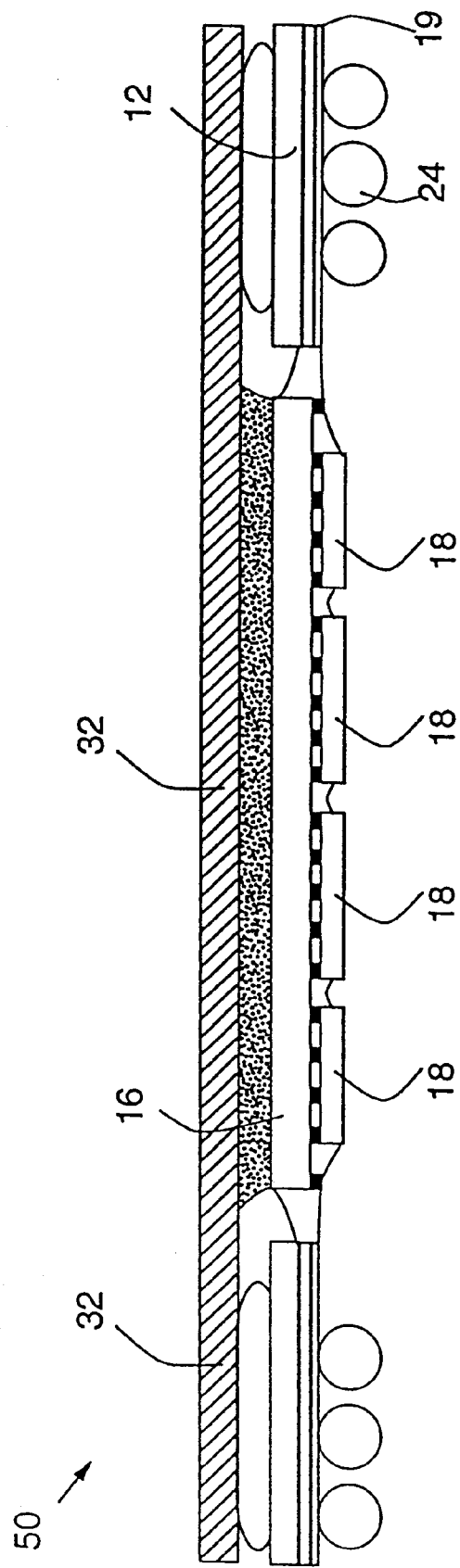
FIG. 4 shows an embodiment in which a plurality of second semiconducter chips are positioned on and electrically coupled to a single, larger semiconductor chip.

Following the aforementioned electrical coupling, it is preferred to add a quantity of encapsulant 28 to substantially cover the external surfaces of first and second semiconductor chips 16, 18 as well as portions of the associated electrical couplings 20 and 26, (and 42 in FIG. 3). One example of such an encapsulant is Hysol FP4511, a flowable, liquid epoxy gel material which features low viscosity and low stress. (Hysol is a trademark of Dexter Corp. Olean, N.Y.). This encapsulant is preferably accomplished with the substrate and other members being inverted in comparison to the orientation of FIGS. 1–4. Encapsulant 28 thus hardens (cures) to the configuration substantially as shown in FIGS. 3 and 4.

In FIG. 2, another electronic package 30 embodiment is shown which has a substrate 12 with a cavity 14 passing, significantly, completely through. A heatsink or coverplate 32 with or without a cavity is bonded to the top surface of substrate 12. The first semiconductor chip 16 is bonded with, for example, Ablebond P1-8971 adhesive 22 to the heatsink 32 in order to provide cooling. Such direct bonding of chip 16 to the heatsink gives superior heat transfer away from the chip. Heatsink 32 also provides mechanical stiffness to the package if needed, for example, if substrate 12 is a flexible member.

In FIG. 3, electronic package 40 has a flexible film 45 with at least one wiring layer attached to substrate 12 with a layer of film adhesive 46 which is preferably an electrically insulative, fiberglass based material such as Chomerics T413 manufactured by Grace Speciality Polymers of Lexington, Me. Part of the wiring layer extends into the cavity 14 in the form of tape leads 42 which are then directly bonded to the first semiconductor chip 16 at the chip's bonding sites 44. The tape leads 42 provide electrical connections between first semiconductor chip 16 and electrically conductive pads 19 on the substrate 12. As in FIG. 1 some of these pads may have metal balls 24 attached. The heatsink 32 is shown in this embodiment to be directly attached to substrate 12 and chip 16 with a layer of bonding material 48 (such as Chomerics T413 listed above).

Heatsink 32 can also be thermally coupled to the second semiconductor chip 18 through the first semiconductor chip if the two chips are thermally coupled, for example with a thermal adhesive material or encapsulant such as Hysol FP4450 from the Dexter Electronic Materials Division, Dexter Corporation of Industry, Calif. (Hysol is a trademark of the Dexter Corporation.) or through a sufficient number of thermally conducting bonds. It is also possible to attach second semiconductor chip 18 directly to heatsink 32 rather than first semiconductor chip 16, without departing from the described invention. For example, flexible film 46 can be attached to first semiconductor chip 16 either before or after attaching second semiconductor chip 18 to chip 16, and before attaching film 46 to substrate 12. This subassembly is inverted from the orientation of FIG. 3 and film 46 is attached to substrate 12 with chip 18 in contact with heatsink 32.

The flexible film 45 used in the embodiment of FIG. 3 can be readily manufactured at low cost using high speed reel-to-reel techniques.

In FIG. 4 another embodiment of the invention, an electronic package 50, is shown with a plurality of second semiconductor chips 18 attached to first semiconductor chip 16 which is attached to heatsink 32. It could also be attached to substrate 12 in the format of FIG. 1. In this arrangement, second semiconductor chips 18 communicate directly to first semiconductor chip 16 but not directly with each other. This arrangement is advantageous for attaching multiple high speed functions which are best implemented in separate chips (e.g. gallium arsenide semiconductor chips) to first semiconductor chip 16 which is preferably a silicon chip.

Figure 5A:
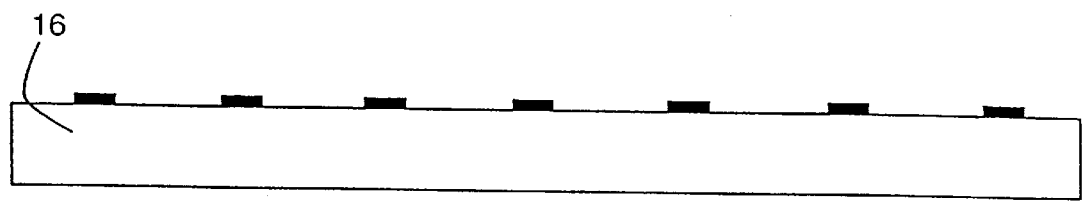
FIGS. 5a and 5b show one possible arrangement of pads on a first semiconductor chip for use in the invention.
Figure 5B:
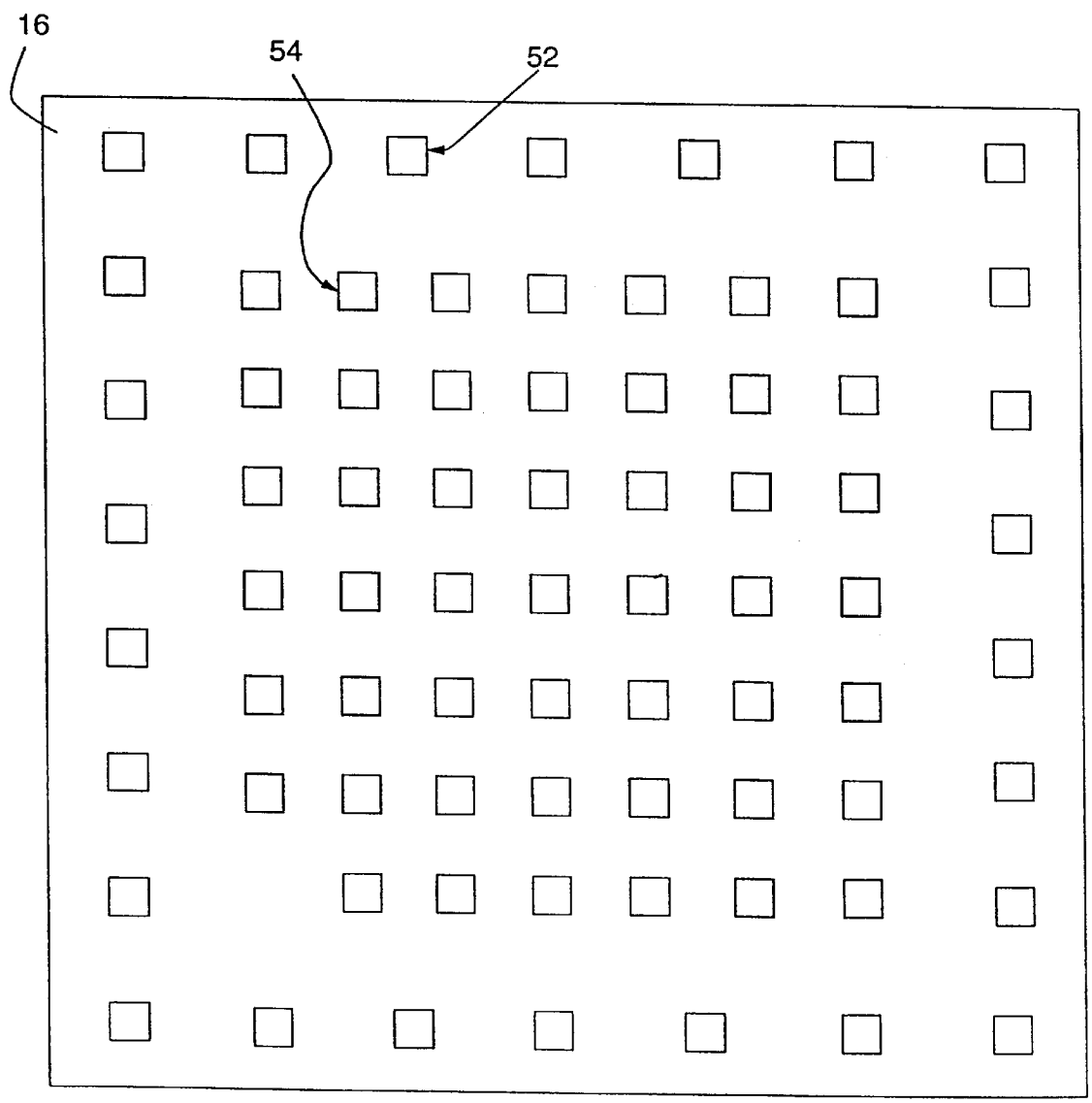
Figures 6A, 6B:
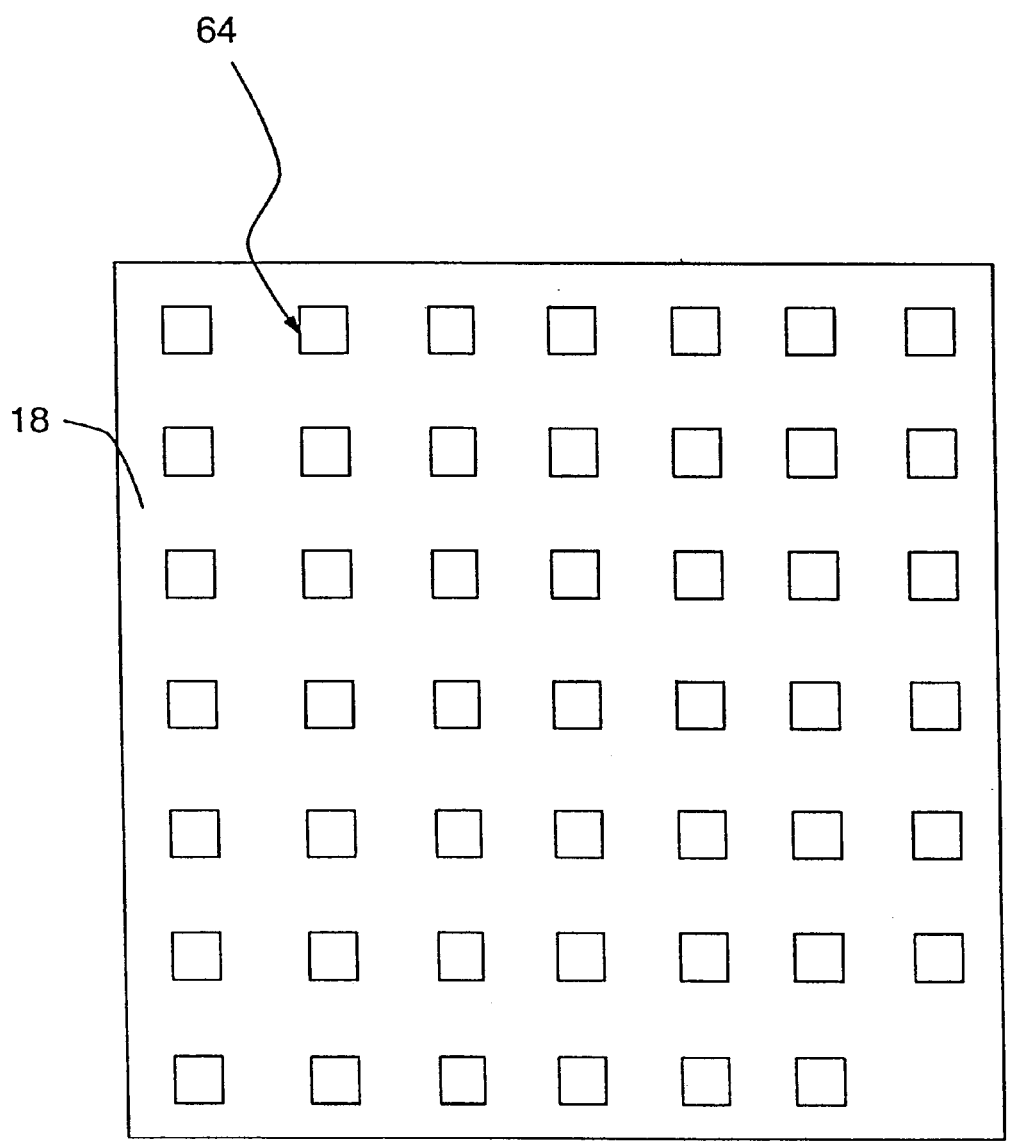
FIGS. 6a and 6b show an arrangement of pads on a second semiconducter chip for use in the inventions.

In another embodiment, bonding pads 52 for connection to substrate 12 may be positioned about the perimeter of first semiconductor chip 16 as shown in FIGS. 5a and 5B. Another group on bonding pads 54 may be arranged in a central array for connections to a corresponding array of bonding pads 64 of the second semiconductor chip 18 as shown in FIG. 6b. Bonding pads 62 may extend above a chip surface as shown in FIG. 6a. Bonding pads 54 and 64 of FIGS. 5b and 6b are shown arranged in a square array of uniformly spaced pads with one corner pad omitted for orientation purposes.

Thus, there have been shown and described a semiconductor chip package wherein at least two semiconductor chips are electrically coupled with one also electrically coupled to and positioned within a cavity in a substrate. The package as defined facilitates positioning the chips relative to bonding pads located on a first surface of the substrate. Furthermore, the package is readily adapted for subsequent placement and coupling to a separate conductive substrate such as a printed circuit board or the like.

While there have been shown and described what are at present considered the preferred embodiments of the invention, it will be obvious to those skilled in the act that various modifications and changes may be made therein without departing from the scope of the invention as defined by the appended claims.

What is claimed is:

1. A method of making an electronic package, said method comprising:

provi ding a circuitized substrate having a first cavity therein, said cavity passing completely through said substrate, and including a first surface and a second surface;

positioning a plurality of electrically conductive members on said first surface of said circuitized substrate, at least some of said conductive members located about the periphery of said cavity;

providing a thick planar heatsink having a second cavity, and bonding said heatsink to said second surface of said substrate with said second cavity overlapping at least partially said first cavity;

positioning a first semiconductor chip substantially within said first and second cavities and thermally coupled to said planar heatsink;

directly electrically coupling said first semiconductor chip to said at least some of said conductive members located about said periphery of said cavity;

positioning a second semiconductor chip on said first semiconductor chip and having an external surface of said second semiconductor chip substantially coplanar with said first surface of said circuitized substrate; and electrically coupling said second semiconductor chip to said first semiconductor chip.

2. The method of claim 1 wherein the step of said directly electrically coupling said first semiconductor chip to said at least some of said conductive members located about said periphery of said cavity further comprises bonding of conventional wire bonds to said first semiconductor chip and said conductive members.

3. The method of claim 1 wherein said first semiconductor chip is electrically coupled to said at least some of said conductive members located about said periphery of said cavity by bonding tape leads to said first semiconductor chip.

4. The method of claim 1 further comprising positioning a plurality of solder members on and electrically connected to respective ones of said conductive members.

5. The method of claim 1 further comprising substantially covering said first semiconductor chip and said second semiconductor chip with a quantity of encapsulant material.

* * * * *